United States Patent
Lim et al.

(10) Patent No.: US 12,165,701 B2
(45) Date of Patent: Dec. 10, 2024

(54) SEMICONDUCTOR DEVICE INCLUDING STANDARD CELLS

(71) Applicant: SAMSUNG ELECTRONICS CO., LTD., Suwon-si (KR)

(72) Inventors: Jaehyun Lim, Hwaseong-si (KR); Taehyung Kim, Yongin-si (KR); Sangshin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 279 days.

(21) Appl. No.: 17/824,464

(22) Filed: May 25, 2022

(65) Prior Publication Data

US 2022/0383948 A1 Dec. 1, 2022

(30) Foreign Application Priority Data

May 31, 2021 (KR) .................. 10-2021-0070208
Aug. 4, 2021 (KR) .................. 10-2021-0102663

(51) Int. Cl.
*G11C 11/41* (2006.01)
*G11C 11/419* (2006.01)
*H01L 27/02* (2006.01)
*H10B 10/00* (2023.01)

(52) U.S. Cl.
CPC ........ *G11C 11/419* (2013.01); *H01L 27/0207* (2013.01); *H10B 10/12* (2023.02); *H10B 10/18* (2023.02)

(58) Field of Classification Search
CPC ..... G11C 11/419; G11C 11/412; G11C 5/025; G11C 7/18; G11C 8/14; H01L 27/0207; H10B 10/12; H10B 10/18
See application file for complete search history.

(56) References Cited

U.S. PATENT DOCUMENTS

| | | |
|---|---|---|
| 7,800,409 B2 | 9/2010 | Pitts |
| 8,698,205 B2 | 4/2014 | Tzeng et al. |
| 9,003,347 B2 | 4/2015 | Lee et al. |
| 9,449,136 B2 | 9/2016 | Pan et al. |
| 10,818,677 B2 | 10/2020 | Lin et al. |
| 10,998,340 B2 | 5/2021 | Guo et al. |
| 2019/0164949 A1 | 5/2019 | Sio et al. |
| 2020/0272781 A1 | 8/2020 | Chang et al. |
| 2020/0402968 A1 | 12/2020 | Zhuang et al. |
| 2022/0102363 A1* | 3/2022 | Xiao ............... H10B 10/18 |

FOREIGN PATENT DOCUMENTS

JP 6136593 B2 5/2017
KR 10-2220682 B1 3/2021

* cited by examiner

*Primary Examiner* — Xiaochun L Chen
(74) *Attorney, Agent, or Firm* — Sughrue Mion, PLLC

(57) ABSTRACT

A semiconductor device includes a first memory column group including a plurality of memory columns in which a plurality of bit cells are disposed; and a first peripheral column group including a plurality of peripheral columns in which a plurality of standard cells are disposed, wherein the plurality of standard cells are configured to perform an operation of reading/writing data from/to the plurality of bit cells through a plurality of bit lines, wherein the first memory column group and the first peripheral column group correspond to each other in a column direction, and wherein at least one of the plurality of peripheral columns has a cell height different from cell heights of the other peripheral columns, the cell height being measured in a row direction in which a gate line is extended.

19 Claims, 15 Drawing Sheets

SEMICONDUCTOR DEVICE INCLUDING STANDARD CELLS

CROSS-REFERENCE TO RELATED APPLICATIONS

This application is based on and claims priority from Korean Patent Application Nos. 10-2021-0070208 and 10-2021-0102663, filed on May 31, 2021 and Aug. 4, 2021, respectively, in the Korean Intellectual Property Office, the disclosures of which are incorporated by reference herein in their entireties.

BACKGROUND

The disclosure relates to a semiconductor device, and more particularly, to a semiconductor device including standard cells.

As down-scaling of semiconductor devices is rapidly progressing recently, high integration and low power consumption of semiconductor devices are required. As a semiconductor manufacturing process is refined, the size of a standard cell is reduced and the width of patterns connecting standard cells to each other are also reduced. Therefore, efficient arrangement and interconnection of standard cells are required.

SUMMARY

The disclosure relates to a semiconductor device with optimized area and performance by respectively arranging standard cells in columns having various heights.

The technical objects of the disclosure are not limited to the technical object mentioned above, and other technical objects not mentioned herein will be clearly understood by those of ordinary skill in the art from the following description.

According to an aspect of embodiments, there is provided a semiconductor device including: a first memory column group including a plurality of memory columns in which a plurality of bit cells are disposed; and a first peripheral column group including a plurality of peripheral columns in which a plurality of standard cells are disposed, wherein the plurality of standard cells are configured to perform an operation of reading/writing data from/to the plurality of bit cells through a plurality of bit lines, wherein the first memory column group and the first peripheral column group correspond to each other in a column direction, and wherein at least one of the plurality of peripheral columns has a cell height different from cell heights of the other peripheral columns, the cell height being measured in a row direction in which a gate line is extended.

According to another aspect of the embodiments, there is provided a semiconductor device including: a cell region in which a memory cell block including a plurality of bit cells is formed; and a peripheral region in which a peripheral circuit configured to read/write data through a plurality of bit lines connected to the memory cell block is formed, wherein the peripheral region includes a plurality of peripheral columns in which a plurality of standard cells are disposed, and wherein at least one of the plurality of peripheral columns has a cell height different from cell heights of the other peripheral columns, the cell height being measured in a row direction in which a gate line is extended.

According to another aspect of the embodiments, there is provided a semiconductor device including: a cell region in which a memory column group, including a plurality of memory columns in which a plurality of bit cells are formed, is disposed; and a peripheral region in which a peripheral column group, including a plurality of peripheral columns in which a plurality of standard cells electrically connected to the plurality of bit cells are formed, is disposed, and which is disposed parallel to the cell region in a column direction, wherein the memory column group and the peripheral column group are aligned with each other in the column direction, and wherein the peripheral column group comprises a first peripheral column and a second peripheral column having different cell heights, the cell height being measured in a row direction in which a gate line is extended.

BRIEF DESCRIPTION OF THE DRAWINGS

Embodiments of the inventive concept will be more clearly understood from the following detailed description taken in conjunction with the accompanying drawings in which.

The drawings accompanied with the present specification may not fit the scale and may show exaggerated or reduced components for convenience of illustration.

DETAILED DESCRIPTION OF THE EMBODIMENTS

Hereinafter, various embodiments are described with reference to the accompanying drawings. All of the embodiments described herein are example embodiments, and thus, the disclosure is not limited thereto and may be realized in various other forms.

Figure 1:
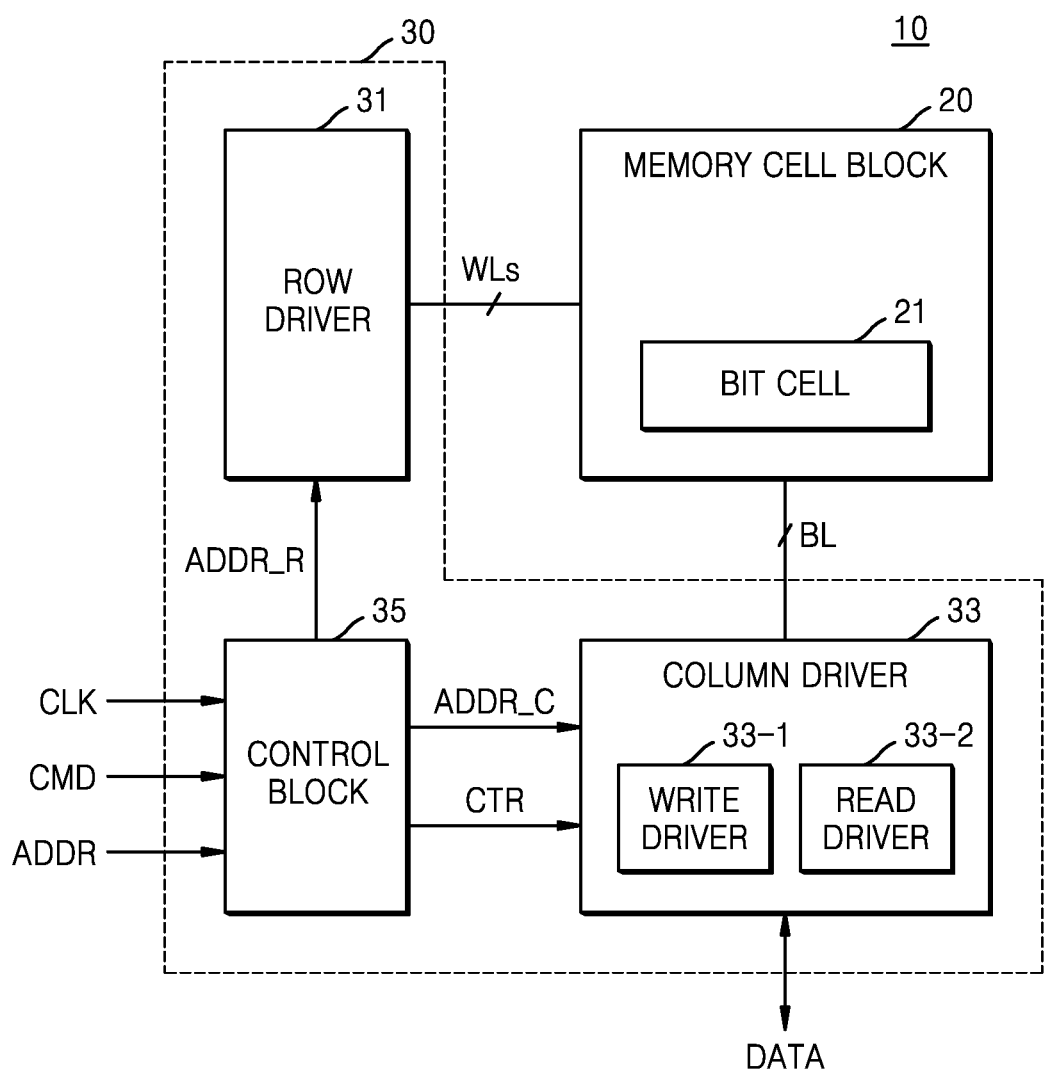
FIG. 1 is a block diagram of a semiconductor device according to an embodiment.

FIG. 1 is a block diagram of a semiconductor device 10 according to an embodiment.

Referring to FIG. 1, the semiconductor device 10 may be a memory device. The semiconductor device 10 according to the present embodiment may be a static random access memory (SRAM), a dynamic RAM (DRAM), a mobile DRAM, a flash memory device, an electrically erasable programmable read-only memory (EEPROM), a resistive RAM (RRAM), a phase-change RAM (PRAM), a ferroelectric RAM (FRAM), etc., but the embodiment is not limited thereto. Hereinafter, for convenience of description, the semiconductor device 10 is described based on an SRAM.

The semiconductor device 10 may receive a command CMD, an address ADDR, a clock signal CLK, and data DATA, and may output the data DATA. For example, the semiconductor device 10 may receive the command CMD instructing write, the address ADDR, and the data DATA that is write data, and store the data DATA in a region of a memory cell block 20 corresponding to the address ADDR. In addition, the semiconductor device 10 may receive the command CMD and the address ADDR instructing read, and output read data stored in the region of the memory cell block 20 corresponding to the address ADDR to the outside of the semiconductor device 10 as the data DATA.

The semiconductor device 10 may include the memory cell block 20 and a peripheral circuit 30. The memory cell block 20 may include a plurality of bit cells 21. The plurality of bit cells 21 may be arranged in a plurality of memory columns and a plurality of memory rows at regular intervals. The plurality of bit cells 21 may be disposed at points where word lines WLs and bit lines BLs cross each other. That is, each of the plurality of bit cells 21 may be connected to at least one of the plurality of word lines WLs and at least one of the plurality of bit lines BLs.

Each of the plurality of bit cells 21 may be a memory cell. For example, each of the plurality of bit cells 21 may be an SRAM cell, or a volatile memory cell, for example, a DRAM cell. In an embodiment, the bit cell 21 may be a non-volatile memory cell such as a flash memory, an RRAM, etc. An example in which the bit cell 21 is an SRAM cell is mainly described in the embodiments, but the embodiments are not limited thereto.

The peripheral circuit 30 may receive the address ADDR, the command CMD, and a clock signal CLK from the outside of the semiconductor device 10, and transmit and receive the data DATA to and from a device outside the semiconductor device 10. The peripheral circuit 30 may include a row driver 31, a column driver 33, and a control block 35. The peripheral circuit 30 may write or read the data DATA to or from the memory cell block 20.

The row driver 31 may be connected to the memory cell block 20 through the plurality of word lines WLs. The row driver 31 may activate at least one of the plurality of word lines WLs based on a row address ADDR_R. That is, the row driver 31 may select at least one word line from among the plurality of word lines WLs. Accordingly, bit cells connected to the activated word line may be selected from among the plurality of bit cells 21.

The column driver 33 may be connected to the memory cell block 20 through the plurality of bit lines BLs. The column driver 33 may select at least one bit line from among the plurality of bit lines BLs based on a column address ADDR_C. The bit line BL and a complementary bit line BLB may be connected to any one of the plurality of bit cells 21, and thus, as the column driver 33 selects the bit line BL and the complementary bit line BLB, bit cells 21 connected to the bit line BL and the complementary bit line BLB may be selected.

The column driver 33 may perform a read operation or a write operation based on a control signal CTR. The column driver 33 may include a read driver 33-2 that performs the read operation and a write driver 33-1 that performs the write operation.

The read driver 33-2 may identify values stored in bit cells, among the plurality of bit cells 21, connected to an activated word line by detecting currents and/or voltages received through the plurality of bit lines BLs, and output the data DATA based on the identified values. The write driver 33-1 may apply currents and/or voltages to the plurality of bit lines BLs based on the data DATA received from the outside of the semiconductor device 10, and write values in bit cells, among the plurality of bit cells 21, connected to an activated word line.

The control block 35 may receive the command CMD, the address ADDR, and the clock signal CLK, and may generate the row address ADDR_R, the column address ADDR_C, and the control signal CTR. For example, the control block 35 may identify a read command by decoding the command CMD, and generate the row address ADDR_R, the column address ADDR_C, and the control signal CTR to read the data DATA from the memory cell block 20. In addition, the control block 35 may identify a write command by decoding the command CMD, and generate the row address ADDR_R, the column address ADDR_C, and the control signal CTR to write the data DATA to the memory cell block 20.

The semiconductor device 10 according to the embodiment may include a cell region in which the memory cell block 20 is formed and a peripheral region in which the peripheral circuit 30 is formed. Peripheral columns of the peripheral region corresponding to memory columns of the cell region in which a specific number of bit cells 21 are disposed may have two or more different cell heights. As standard cells of the peripheral circuit 30 having various heights are disposed in a plurality of peripheral columns of various heights, the area and performance of the semiconductor device 10 may be optimized. A layout of the peripheral circuit 30 is described in detail with reference to FIG. 3.

Figure 2:
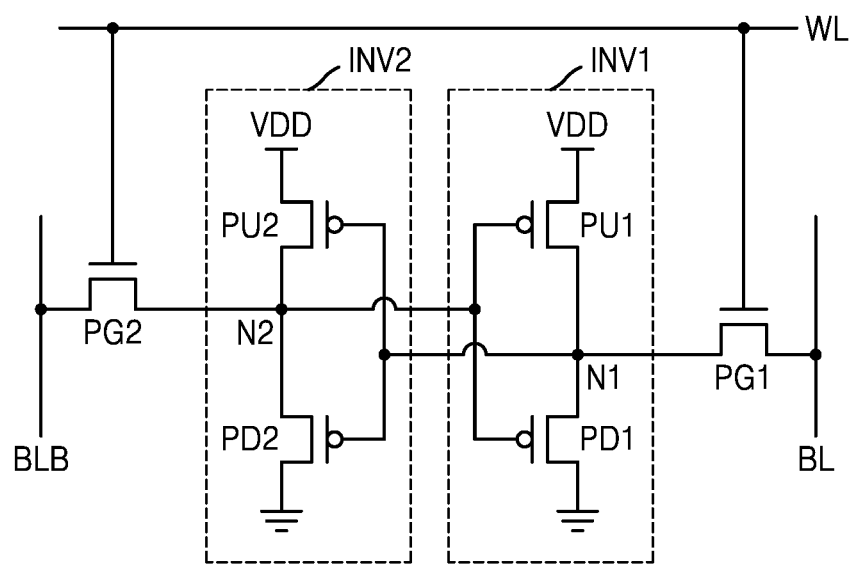
FIG. 2 is a circuit diagram illustrating a bit cell of a semiconductor device, according to an embodiment.

FIG. 2 is a circuit diagram illustrating the bit cell 21 of a semiconductor device 10 shown in FIG. 1, according to an embodiment.

Referring to FIG. 2, the bit cell 21 may be an SRAM unit cell. The bit cell 21 may include a first inverter INV1, a second inverter INV2, a first pass element PG1, and a second pass element PG2.

The first inverter INV1 and the second inverter INV2 may output data having opposite phases. Specifically, the first inverter INV1 may include a first pull-up element PU1 and a first pull-down element PD1. The first pull-up element PU1 may be a PMOS transistor, and the first pull-down element PD1 may be an NMOS transistor, but the embodiment is not limited thereto.

The second inverter INV2 may include a second pull-up element PU2 and a second pull-down element PD2. The second pull-up element PU2 may be a PMOS transistor, and the second pull-down element PD2 may be an NMOS transistor, but the embodiment is not limited thereto.

Sources of the first and second pull-down elements PD1 and PD2 may be connected to a first voltage (e.g., a ground voltage), and sources of the first and second pull-up elements PU1 and PU2 may be connected to a second voltage (e.g., a power voltage VDD) higher than the first voltage. A drain of the first pull-up element PU1 and a drain of the first pull-down element PD1 may be connected to a first node N1, and a drain of the second pull-up element PU2 and a drain of the second pull-down element PD2 may be connected to a second node N2. In addition, an input of the first inverter INV1 may be connected to the second node N2, which is an output node of the second inverter INV2, and an input of the second inverter INV2 may be connected to the first node N1 that is an output node of the first inverter INV1.

A gate of the first pass element PG1 may be connected to the word line WL, a drain thereof may be connected to the bit line BL, and a source thereof may be connected to the first node N1. A gate of the second pass element PG2 may be connected to the word line WL, a drain thereof may be connected to the complementary bit line BLB, and a source thereof may be connected to the second node N2. Here, an inverted signal of a signal of the bit line BL may be applied to the complementary bit line BLB.

The bit cell 21 may operate as follows. When a potential of the word line WL is logic high, the first pass element PG1 and the second pass element PG2 are turned on, so that the signals of the bit line BL and the complementary bit line BLB are respectively transmitted to the first inverter INV1 and the second inverter INV2, and thus, an operation of writing or reading data may be performed.

Figure 3:
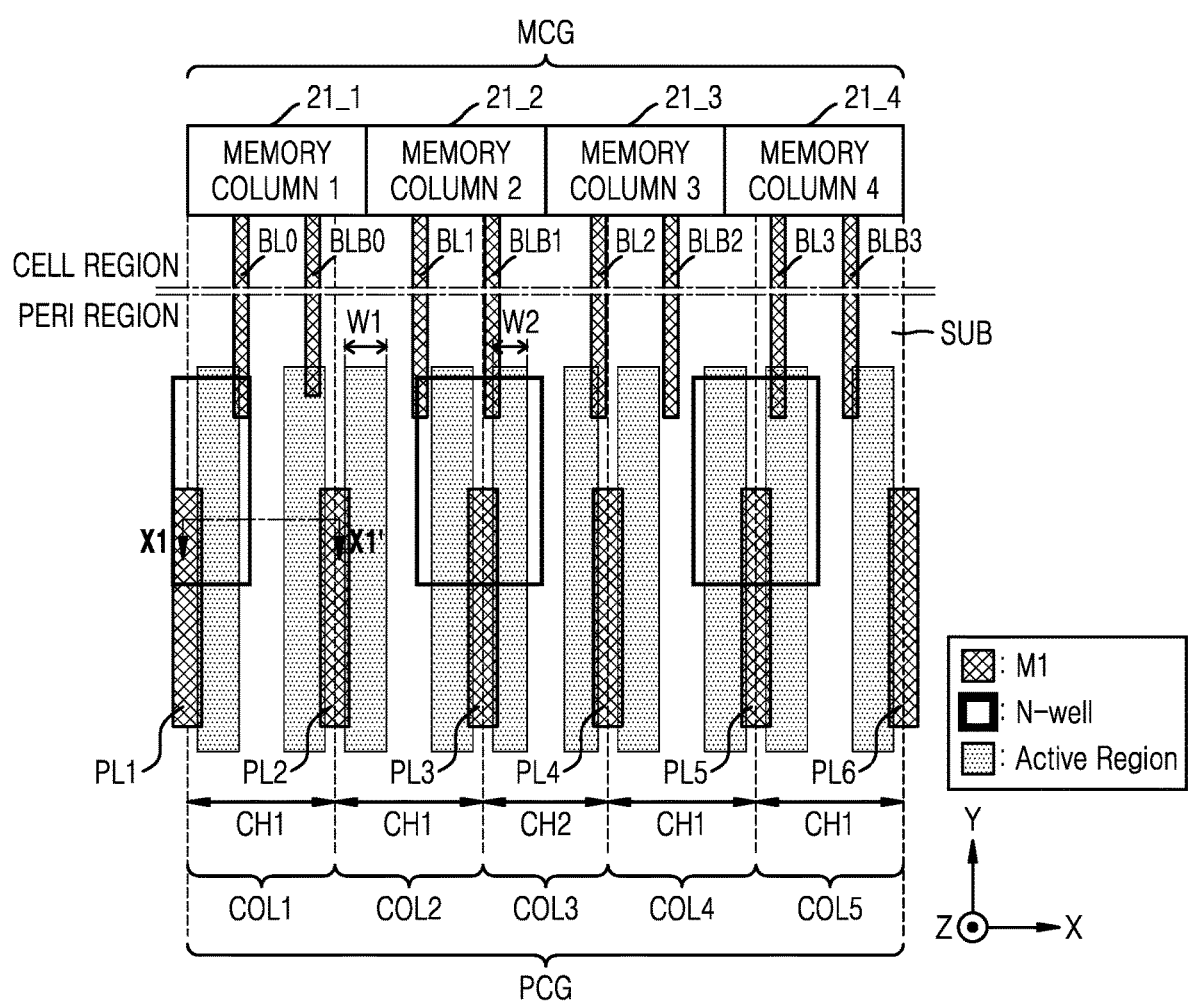
FIG. 3 is a diagram illustrating a layout of a semiconductor device, according to an embodiment.

FIG. 3 is a diagram illustrating a layout of the semiconductor device 10, according to an embodiment. FIG. 3 is a plan view illustrating a part of the semiconductor device 10 of FIG. 1 on a plane including an X axis and a Y axis. Herein, an X axis direction and a Y axis direction may be respectively referred to as a row direction and a column direction and a Z-axis direction may be referred to as a vertical direction. The plane including the X-axis and the Y-axis may be referred to as a horizontal plane, a component disposed in a +Z-axis direction in comparison to another component may be referred to as being above the other component, and a component disposed in a −Z-axis direction in comparison to another component may be referred to as being below the other component. In addition, the area of the component may refer to the size occupied by the component on a plane parallel to a horizontal plane, and the height of the component may refer to the length of the component in the X-axis direction in parallel with an upper surface of a substrate on which the semiconductor device 10 is formed.

Referring to FIG. 3, the memory cell block 20 of FIG. 1 of the semiconductor device 10 may be formed in a cell region, and the peripheral circuit 30 of FIG. 1 of the semiconductor device 10 may be formed in a peripheral region. The cell region may include the bit cells (21 of FIG. 1), and the bit cells 21 may be arranged according to a plurality of memory columns.

A certain number of memory columns adjacent to each other and sequentially arranged in the X-axis direction may constitute one memory column group MCG. For example, the memory column group MCG may include first to fourth memory columns 21_1 to 21_4 that are adjacent to each other and sequentially arranged in the X-axis direction.

Each of the first to fourth memory columns 21_1 to 21_4 may include the bit cells 21 disposed in one column. Each of the first to fourth memory columns 21_1 to 21_4 may be connected to a corresponding bit line (one of bit lines BL0 to BL3) and a corresponding complementary bit line (one of complementary bit lines BLB0 to BLB3). The bit cells 21 disposed in the first to fourth memory columns 21_1 to 21_4 and standard cells (e.g., standard cells in which circuits constituting the column driver 33 of FIG. 1 are implemented) disposed in a peripheral column group PCG may be electrically connected through the bit lines BL0 to BL3 and the complementary bit lines BLB0 to BLB3.

A plurality of standard cells may be disposed in the peripheral region. A standard cell is a unit of layout and may be designed to perform a predefined function. The peripheral region may include multiple various standard cells, and the standard cells are arranged according to a plurality of peripheral columns, so that the peripheral circuit 30 may be implemented.

A certain number of peripheral columns adjacent to each other and sequentially arranged in the X-axis direction among the plurality of peripheral columns may constitute one peripheral column group PCG. For example, one peripheral column group PCG may include first to fifth peripheral columns COL1 to COL5 that are adjacent to each other and sequentially arranged in the X-axis direction.

The peripheral column group PCG may correspond to the memory column group MCG. That is, the peripheral column group PCG and the memory column group MCG may be aligned with each other in the Y-axis direction, and may have the same width in the X-axis direction. FIG. 3 illustrates that the four first to fourth memory columns 21_1 to 21_4 and the five first to fifth peripheral columns COL1 to COL5 correspond to each other at a ratio of 4:5, but the ratio is not limited thereto and may be modified in various ways.

In an embodiment, the peripheral column group PCG may include columns having different heights. For example, the first, second, fourth, and fifth peripheral columns COL1, COL2, COL4, and COL5 may have a first cell height CH1, and the third peripheral column COL3 disposed in the center of the peripheral column group PCG may have a second cell height CH2 that is different from the first cell height CH1. For example, the first cell height CH1 may be greater than the second cell height CH2. A process of manufacturing the semiconductor device 10 may be simplified by disposing the third peripheral column COL3 having the only different cell-height in the center of the peripheral column group PCG and disposing the first and second peripheral columns COL1 and COL2 having the same cell height to be adjacent to each other on the left side of the third peripheral column COL3 and disposing the fourth and fifth peripheral columns COL4 and COL5 having the same cell height to be adjacent to each other on the right side of the third peripheral column COL3. FIG. 3 illustrates that the peripheral column group PCG includes peripheral columns having two different heights, but the embodiment is not limited thereto, and the peripheral column group PCG may include peripheral columns having three or more different heights.

A standard cell requiring a relatively great driving force, a relatively high performance, or a relatively high device density (integration degree) among the standard cells disposed in the peripheral region may be disposed in a peripheral column which has a relatively great cell height or the greatest cell height. For example, a multiplexer MUX included in the write driver 33-1 in FIG. 1 and the read driver 33-2 in FIG. 1 of the column driver 33 may require a relatively great driving force compared to the other configuration of the column driver 33, and may be implemented as a standard cell disposed in the first, second, fourth, and/or fifth peripheral columns COL1, COL2, COL4, and COL5 rather than the third peripheral column COL3.

A standard cell requiring a relatively small driving force, a relatively low performance, or a relatively low device density (integration degree) among the standard cells disposed in the peripheral region may be disposed in a peripheral column which has a relatively small cell height or the smallest cell height, so that integration of the peripheral region may be increased. Accordingly, in the semiconductor device 10 according to the embodiment, standard cells having various heights may be disposed in a plurality of peripheral columns of various heights corresponding to memory columns in which a specific number of bit cells are disposed. The area and performance of the peripheral region in which the peripheral circuit 30 of the semiconductor device 10 is formed may be optimized.

A plurality of power lines, for example, first to sixth power lines PL1 to PL6, supplying voltages to the standard cells disposed in the first to fifth peripheral columns COL1 to COL5 may be respectively disposed at boundaries of the first to fifth peripheral columns COL1 to COL5. The first to sixth power lines PL1 to PL6 may be formed in a conductive pattern extending in the Y-axis direction and may be spaced apart from each other and sequentially arranged in the X-axis direction. For example, a power voltage may be applied to each of the first, third, and fifth power lines PL1, PL3, and PL5, and a ground voltage of a level lower than that of the power voltage may be applied to each of the second, fourth, and sixth power lines PL2, PL4, and PL6.

A plurality of active regions extending in the Y-axis direction and spaced apart from each other and sequentially arranged in the X-axis direction may be formed in the peripheral region. In an embodiment, two active regions may be formed in each of the first to fifth peripheral columns COL1 to COL5. As the height of the first peripheral column COL1 is greater than the height of the third peripheral column COL3, a width W1 of the active region formed in the first peripheral column COL1 in the X-axis direction may be greater than a width W2 of the active region formed in the third peripheral column COL3 in the X-axis direction.

An active pattern formed in the active region may cross a gate line or gate structure extending in the X-axis direction to form a transistor. For example, an N-type transistor may be formed in an active region formed on a substrate SUB, and a P-type transistor may be formed in an active region formed in an N-well doped with N-type impurities.

The N-well may be formed across different peripheral columns in the first to fifth peripheral columns COL1 to COL5. For example, one N-well may be formed across the second peripheral column COL2 and the third peripheral column COL3, another N-well may be formed across the fourth peripheral column COL4 and the fifth peripheral column COL5, and another N-well may be formed across a peripheral column adjacent to the peripheral column group PCG in the −X-axis direction and the first peripheral column COL1. Unlike in FIG. 3, the N-wells may be formed in various shapes on the substrate SUB according to the number and arrangement of N-type transistors and P-type transistors in the peripheral circuit 30 formed in the peripheral region.

At least one fin of fin structure extending in the Y-axis direction, or a nanowire or nanosheet may be formed in the active region. Accordingly, the shape of the active pattern formed in the active region is described in detail with reference to FIGS. 7A and 7B.

The active region may include a semiconductor such as silicon (Si) or germanium (Ge), or a compound semiconductor such as SiGe, SiC, GaAs, InAs or InP. In an embodiment, the gate line may include a work function metal-containing layer and a gap-fill metal layer. For example, the work function metal-containing layer may include at least one metal among Ti, W, Ru, Nb, Mo, Hf, Ni, Co, Pt, Yb, Tb, Dy, Er, and Pd, and the gap-fill metal layer may include a W layer or an Al layer. In an embodiment, the gate line may include a stack structure of TiAlC/TiN/W, a stack structure of TiN/TaN/TiAlC/TiN/W, or a stack structure of TiN/TaN/TiN/TiAlC/TiN/W.

In the peripheral region, metal layers stacked in the Z-axis direction, for example, a first metal layer M1, may be formed. A pattern formed in the first metal layer M1 may include metal, conductive metal nitride, metal silicide, or a combination thereof. For example, the pattern formed in the first metal layer M1 may include a conductive material such as tungsten (W), molybdenum (Mo), titanium (Ti), cobalt (Co), tantalum (Ta), nickel (Ni), tungsten silicide, titanium silicide, cobalt silicide, tantalum silicide, nickel silicide, etc. Although only the first metal layer M1 is illustrated in FIG. 3, a second metal layer formed on the first metal layer M1 may be further formed, and the pattern of the first metal layer M1 and a pattern of the second metal layer may be connected to each other through a via.

In an embodiment, the first to sixth power lines PL1 to PL6 may be formed in the pattern of the first metal layer M1. However, the semiconductor device 10 according to the embodiment is not limited thereto, and the first to sixth power lines PL1 to PL6 may be formed as a pattern of an upper layer of the first metal layer M1 or may be formed as a type buried in the substrate SUB.

Also, in an embodiment, the bit lines BL0 to BL3 and the complementary bit lines BLB0 to BLB3 may be formed as the pattern of the first metal layer M1 and may extend in the Y-axis direction. However, the embodiment is not limited thereto, and the bit lines BL0 to BL3 and the complementary bit lines BLB0 to BLB3 may be formed as the pattern of the upper layer of the first metal layer M1.

Figure 4:
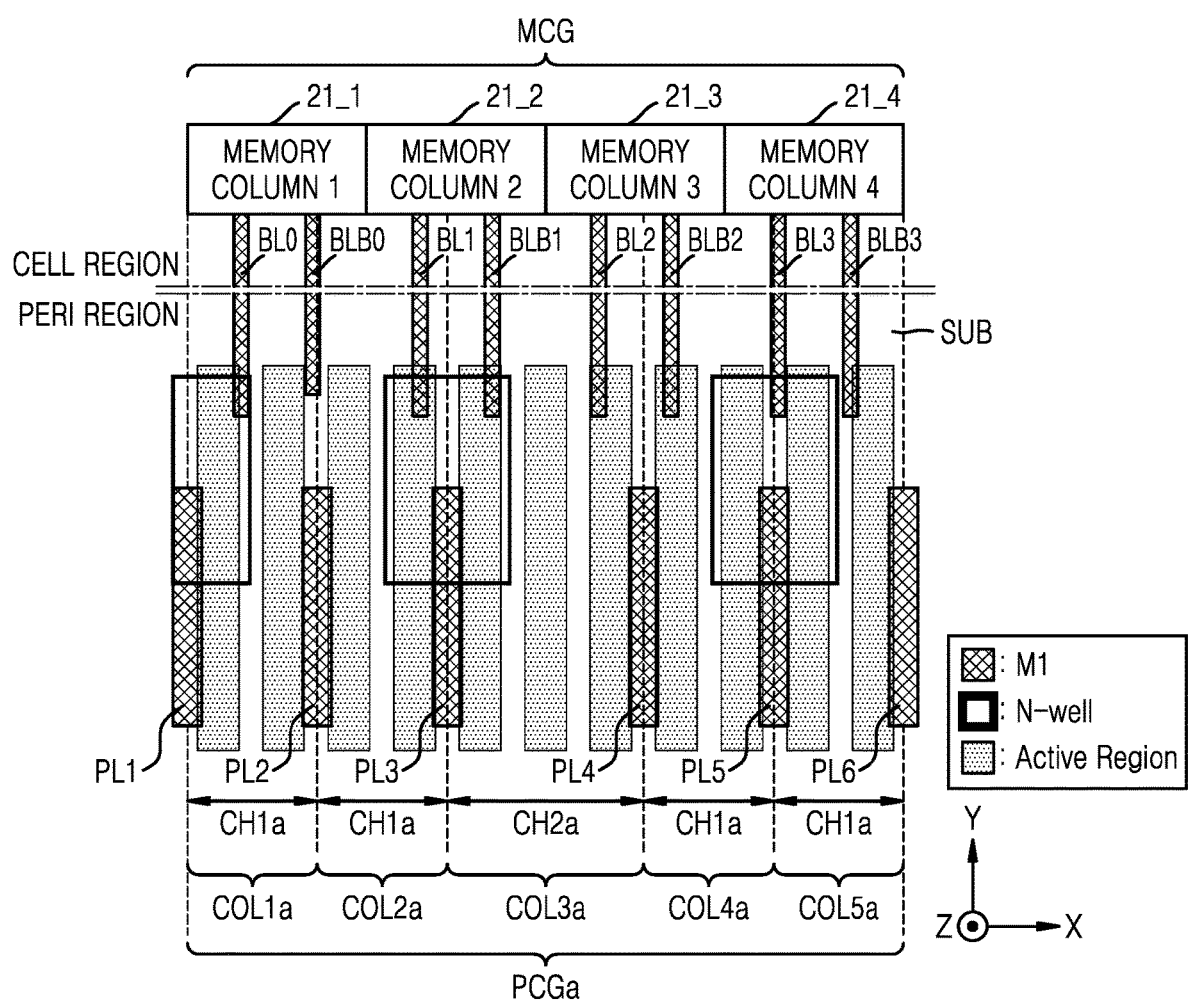
FIGS. 4 to 6 are diagrams illustrating a layout of a semiconductor device, according to an embodiment.
Figure 5:
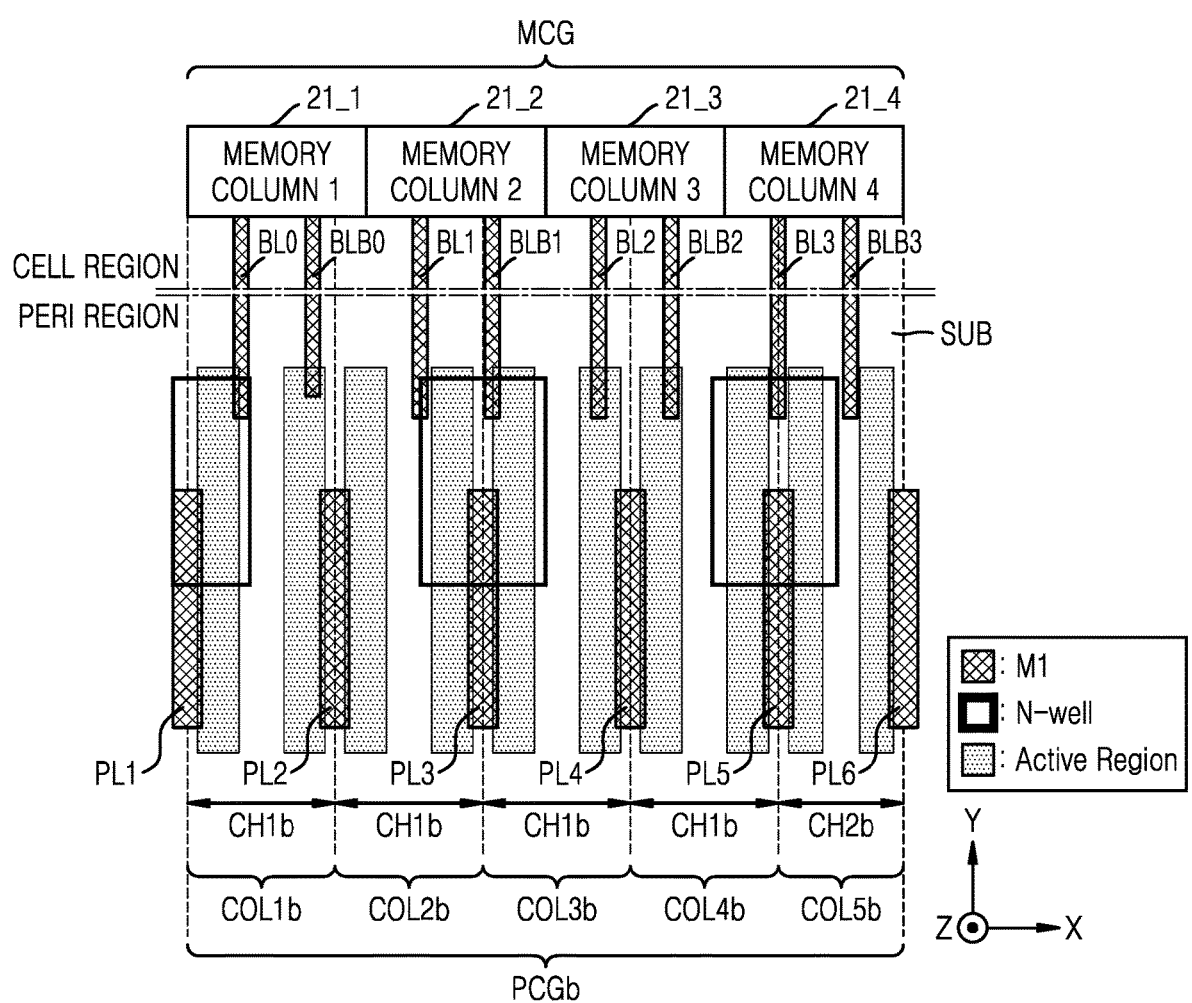
Figure 6:
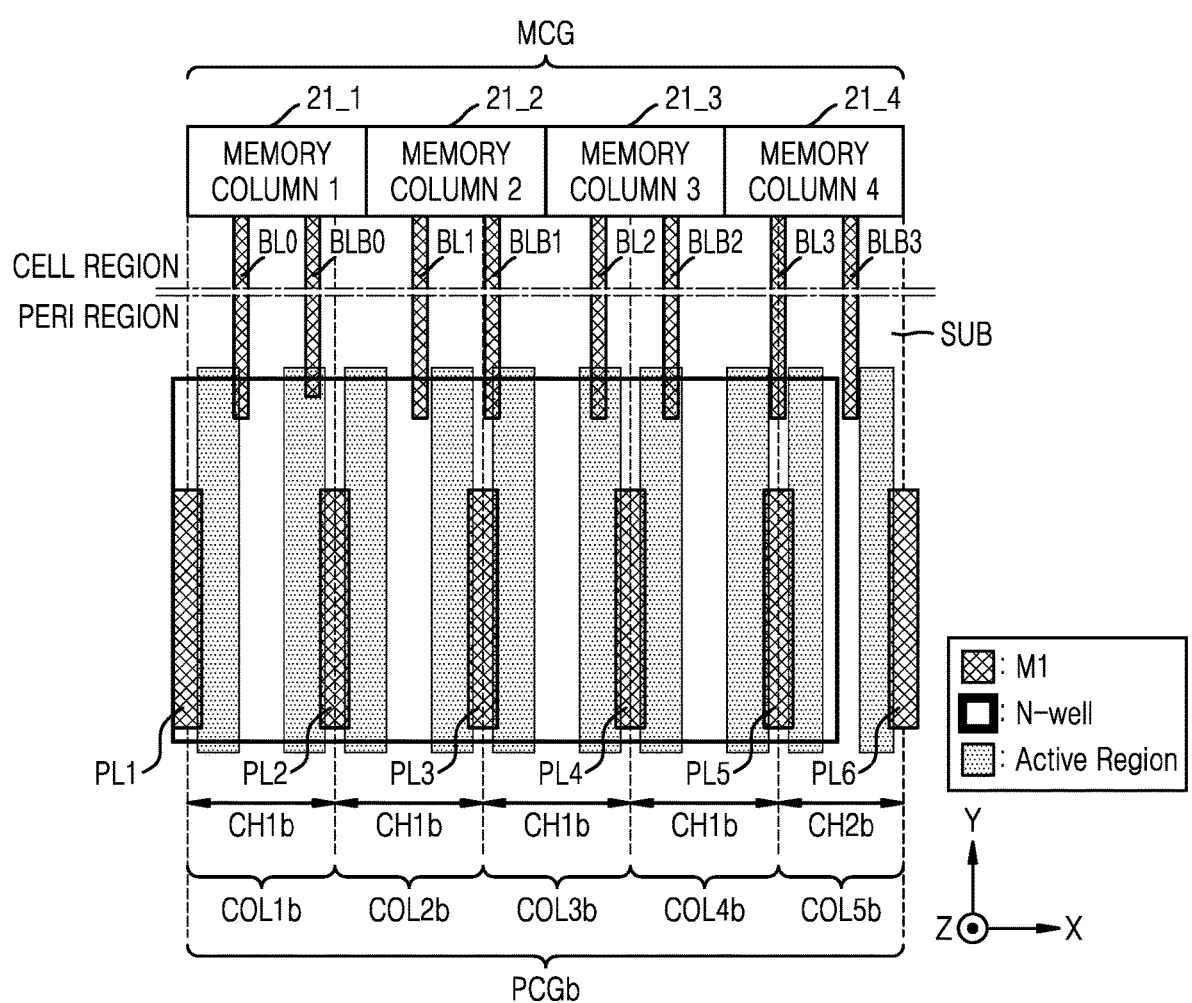

FIGS. 4 to 6 are diagrams illustrating a layout of a semiconductor device, according to embodiments. In FIGS. 4 to 6, redundant descriptions of the same reference numerals as those in FIG. 3 are omitted.

Referring to FIG. 4, a certain number of peripheral columns adjacent to each other and sequentially arranged in an X-axis direction among a plurality of peripheral columns may constitute one peripheral column group PCGa. For example, one peripheral column group PCGa may include first to fifth peripheral columns COL1a to COL5a that are adjacent to each other and sequentially arranged in the X-axis direction.

The peripheral column group PCGa may correspond to the memory column group MCG. That is, the peripheral column group PCGa and the memory column group MCG may be aligned with each other in a Y-axis direction, and may have the same width in the X-axis direction.

In an embodiment, the peripheral column group PCGa may include columns having different heights. For example, the first, second, fourth, and fifth peripheral columns COL1a, COL2a, COL4a, and COL5a may have a first cell height CH1a, and the third peripheral column COL3a may have a second cell height CH2a that is different from the first cell height CH1a. The first cell height CH1a may be smaller than the second cell height CH2a.

In an embodiment, a greater number of active regions may be disposed in a peripheral column which has a relatively a greater height than in a peripheral column which has a relatively smaller height. For example, two active regions may be formed in the first peripheral column COL1a, and three active regions may be formed in the third peripheral column COL3a. However, unlike shown in FIG. 4, the number of active regions disposed in one peripheral column may be modified in various ways.

Referring to FIG. 5, a certain number of peripheral columns adjacent to each other and sequentially arranged in an X-axis direction among a plurality of peripheral columns may constitute one peripheral column group PCGb. For example, one peripheral column group PCGb may include first to fifth peripheral columns COL1b to COL5b that are adjacent to each other and sequentially arranged in the X-axis direction.

The peripheral column group PCGb may correspond to the memory column group MCG. That is, the peripheral column group PCGb and the memory column group MCG may be aligned with each other in the Y-axis direction and may have the same width in the X-axis direction.

In an embodiment, the peripheral column group PCGb may include columns having different heights. For example, the first to fourth peripheral columns COL1b to COL4b may have a first cell height CH1b, and the fifth peripheral column COL5b that is most adjacent to a boundary between the peripheral column group PCGb and another peripheral column group may have a second cell height CH2b that is different from the first cell height CH1b. In this regard, the first cell height CH1b may be greater than the second cell height CH2b. A process of manufacturing the semiconductor device 10 may be simplified by disposing the fifth peripheral column COL5 having the only different cell-height to be adjacent to the boundary.

As the height of the fourth peripheral column COL4b is greater than the height of the fifth peripheral column COL5b, a width of an active region formed in the fourth peripheral column COL4b in the X-axis direction may be greater than a width of an active region formed in the fifth peripheral column COL5b in the X-axis direction.

Referring to FIG. 6, the peripheral column group PCGb may include the first to fifth peripheral columns COL1b to COL5b that are sequentially arranged and adjacent to each other in the X-axis direction. A plurality of active regions extending in the Y-axis direction and spaced apart from each other in the X-axis direction may be formed in the first to fifth peripheral columns COL1b to COL5b.

An N-well may be formed across different peripheral columns in the first to fifth peripheral columns COL1b to COL5b. For example, one N-well may be formed across the first to fifth peripheral columns COL1b to COL5b. Unlike in FIG. 6, the N-well may be formed in various shapes on the substrate SUB according to the number and arrangement of N-type transistors and P-type transistors in the peripheral circuit 30 formed in a peripheral region.

Figure 7A:
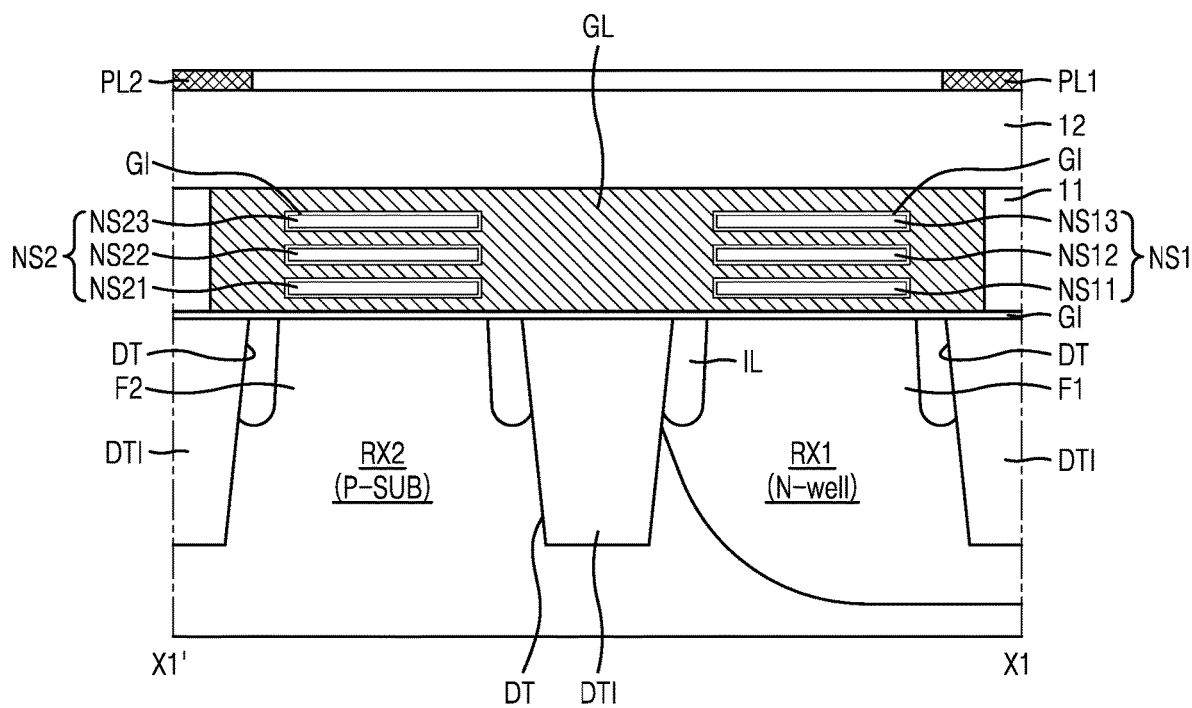
FIGS. 7A and 7B are cross-sectional views of a standard cell included in a semiconductor device, according to embodiments.
Figure 7B:
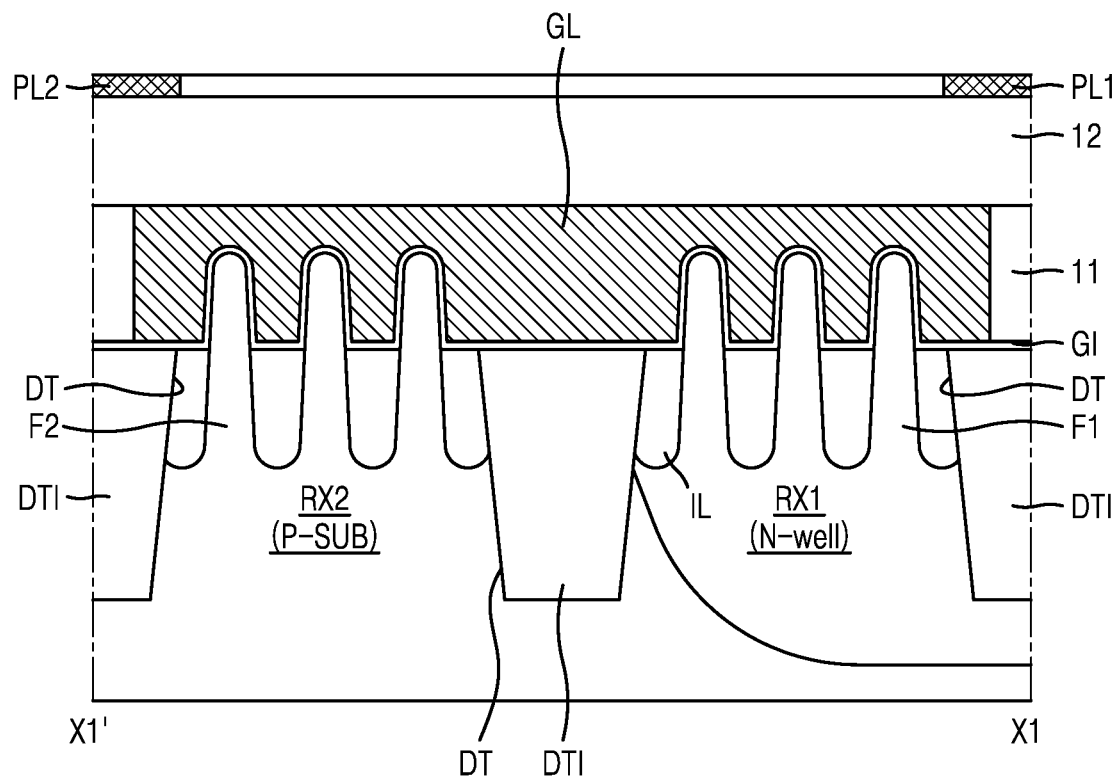

FIGS. 7A and 7B are cross-sectional views of a standard cell included in a semiconductor device, according to embodiments, taken along line X1-X1' of FIG. 3. FIG. 7A illustrates an example in which nanosheets are formed in an active region, and FIG. 7B illustrates an example in which a plurality of fins are formed in the active region. However, the semiconductor device according to the embodiment is not limited to those illustrated in FIGS. 7A and 7B.

For example, in a peripheral region of the semiconductor device, a gate-all-around (GAA) FET may be formed in which a nanowire formed on the active region is surrounded by a gate line, and a vertical GAA FET may be formed in which a plurality of nanowires are vertically stacked on the active region and are surrounded by the gate line. For example, a multi-bridge channel (MBC) FET in which a plurality of nanosheets are stacked on the active region and surrounded by the gate line may be formed. Also, for example, a negative capacitance (NC) FET may be formed in the active region. In addition to examples of the transistors described above, various transistors (e.g., complementary FET (CFET), negative capacitance FET (NCFET), carbon nanotube (CNT) FET, bipolar junction transistors, and other three-dimensional transistors) may be formed in the gate line and the active region.

Referring to FIG. 7A, a first active region RX1 and a second active region RX2 may be formed on a substrate P-SUB. In an embodiment, the second active region RX2 may be formed in the substrate P-SUB doped with P-type impurities, and the first active region RX1 may be formed in an N-well formed in the substrate P-SUB.

The substrate P-SUB may include a semiconductor material such as silicon, germanium, or silicon-germanium, or a Group III-V compound such as GaAs, AlGaAs, InAs, InGaAs, InSb, GaSb, InGaSb, InP, GaP, InGaP, InN, GaN, or InGaN. In an embodiment, the substrate P-SUB may be a silicon-on-insulator (SOI) substrate or a germanium-on-insulator (GOI) substrate. In an embodiment, the substrate P-SUB may be doped with P-type impurities.

An isolation trench DT may be formed between the first active region RX1 and the second active region RX2. The isolation trench DT may be filled with an insulating material (e.g., oxide) so that an element isolation layer DTI may be formed. The first active region RX1 and the second active region RX2 may be isolated from each other by the element isolation layer DTI. The isolation trench DT may also be formed below the first power line PL1 and the second power line PL2, and the element isolation layer DTI may be formed.

In an embodiment, a nanosheet may be formed on each of the first active region RX1 and the second active region RX2. A first nanosheet stack NS1 may be formed on the first active region RX1 and a second nanosheet stack NS2 may be formed on the second active region RX2. The first nanosheet stack NS1 and the second nanosheet stack NS2 may extend in the Y-axis direction.

The first nanosheet stack NS1 and the second nanosheet stack NS2 may function as channels of transistors. For example, the first nanosheet stack NS1 may be doped with p-type impurities and may form a p-type transistor. Meanwhile, the second nanosheet stack NS2 may be doped with n-type impurities and may form an n-type transistor. In an embodiment, the first nanosheet stack NS1 and the second nanosheet stack NS2 may include Si, Ge, or SiGe. In an embodiment, the first nanosheet stack NS1 and the second nanosheet stack NS2 may include InGaAs, InAs, GaSb, InSb, or a combination thereof.

The first nanosheet stack NS1 and the second nanosheet stack NS2 may respectively include a plurality of nanosheets NS11 to NS13 and a plurality of nanosheets NS21 to NS23 overlapping on upper surfaces of a first fin F1 and a second fin F2 in a vertical direction (the Z-axis direction). In the present disclosure, each of the first nanosheet stack NS1 and the second nanosheet stack NS2 includes three nanosheets, but the embodiment is not limited thereto. For example, each of the first nanosheet stack NS1 and the second nanosheet stack NS2 may include at least two nanosheets and the number of nanosheets is not particularly limited.

An element insulating layer IL (e.g., oxide) may be formed between the first fin F1 and the element isolation layer DTI and between the second fin F2 and the element isolation layer DTI.

A gate line GL may surround each of the plurality of nanosheets NS11 to NS13 and NS21 to NS23 thus covering the first nanosheet stack NS1 and the second nanosheet stack NS2 on the first fin F1 and the second fin F2. The plurality of nanosheets NS11 to NS13 and NS21 to NS23 may have a GAA structure in which the plurality of nanosheets NS11 to NS13 and NS21 to NS23 are surrounded by the gate line GL. A gate insulating layer GI may be between the first nanosheet stack NS1 and the second nanosheet stack NS2 and the gate line GL. The gate insulating layer GI and the gate line GL may be formed to extend in the X-axis direction. The gate insulating layer GI and the gate line GL may cover an upper surface of each of the first fin F1 and the second fin F2, an upper surface of the element insulating layer IL, and an upper surface of the element isolation layer DTI.

A first interlayer insulating layer 11 and a second interlayer insulating layer 12 may be formed on the gate insulating layer GI. A source/drain contact and a source/drain via connecting a source/drain region to a pattern of the first metal layer (M1 of FIG. 3) may be formed through the first interlayer insulating layer 11. Also, a gate contact and a gate via connecting the gate line GL to the pattern of the first metal layer M1 may be formed through the second interlayer insulating layer 12.

Referring to FIG. 7B, a plurality of first fins F1 and a plurality of second fins F2 may extend parallel to each other in the Y-axis direction. An element insulating layer may be formed between each of the plurality of first fins F1 and each of the plurality of second fins F2. In the first active region RX1 and the second active region RX2, the plurality of first fins F1 and the plurality of second fins F2 may protrude upward from the element insulating layer IL in a fin shape. FIG. 7B illustrates that three first fins F1 and three second fins F2 are formed, but the embodiment is not limited thereto, and the number of fins formed in the first active region RX1 and the second active region RX2 may be modified in various ways.

The gate insulating layer GI and the gate line GL may be formed to extend in the X-axis direction. The gate insulating layer GI and the gate line GL may cover the upper surface and both sidewalls of each of the plurality of first fins F1 and the plurality of second fins F2, the upper surface of the element insulating layer IL, and the upper surface of the element isolation layer DTI.

Figure 8:
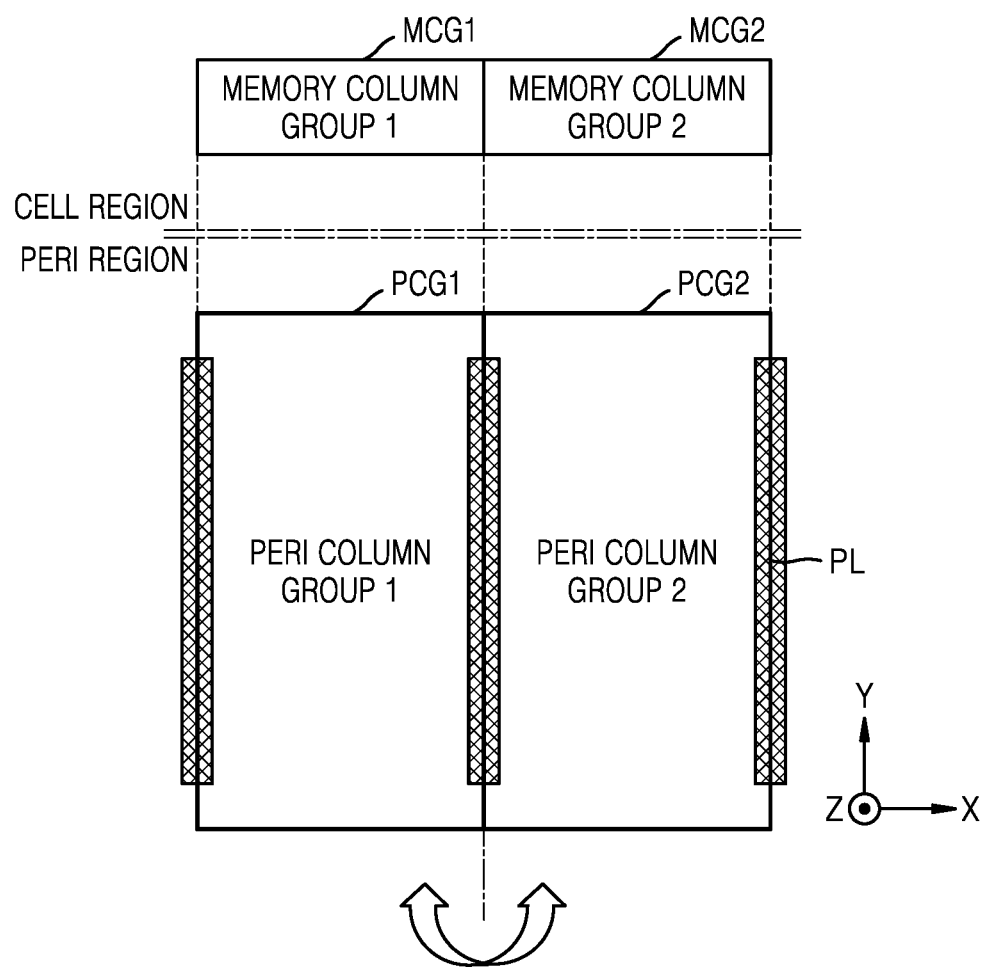
FIGS. 8 and 9 are diagrams illustrating a layout of a semiconductor device, according to embodiments.
Figure 9:
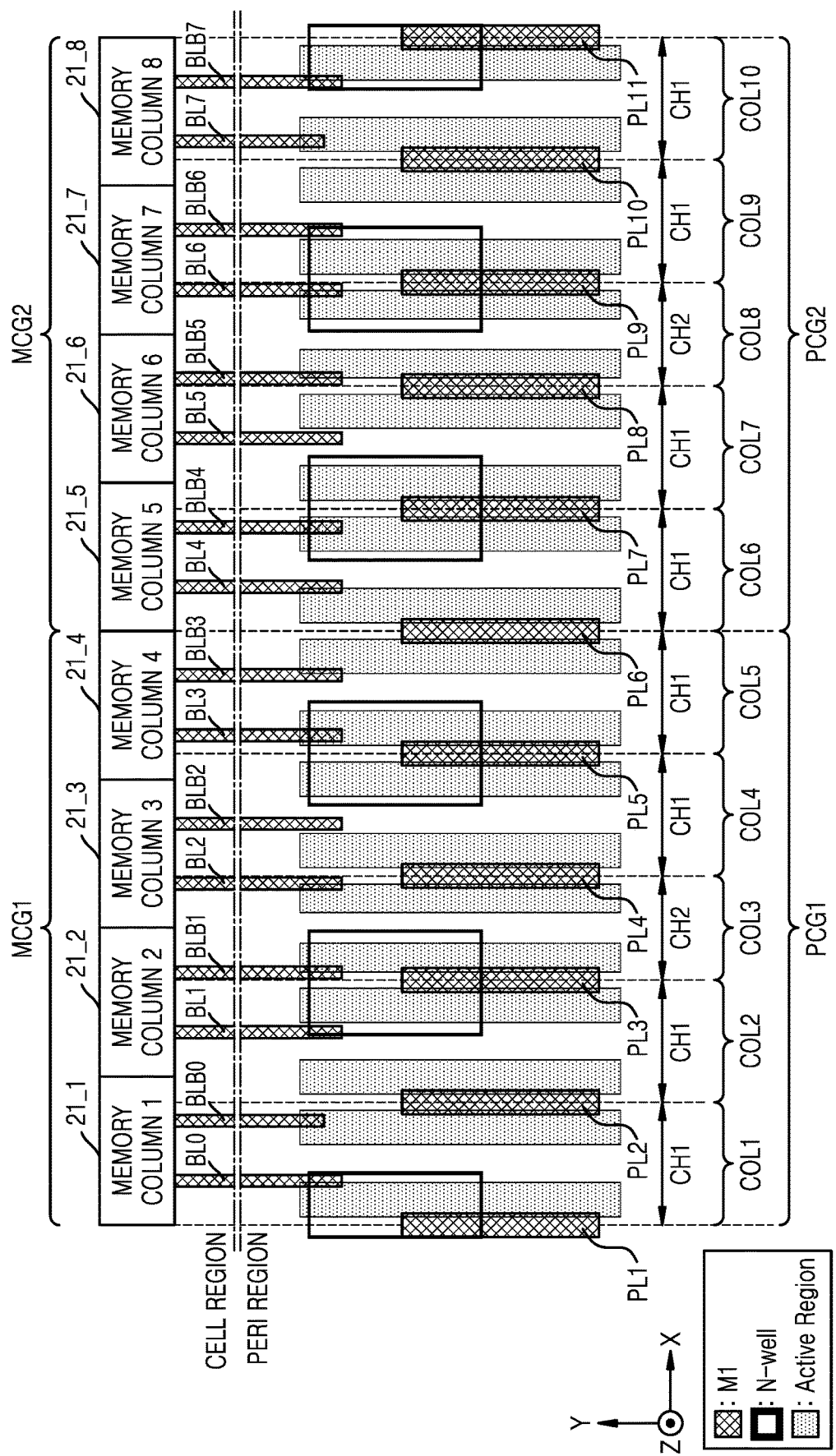

FIGS. 8 and 9 are diagrams illustrating a layout of a semiconductor device, according to embodiments. FIG. 9 is a diagram specifically illustrating the first peripheral column group PCG1 and the second peripheral column group PCG2 described with reference to FIG. 8.

Referring to FIG. 8, a certain number of memory columns adjacent to each other in an X-axis direction may constitute one memory column group in a cell region. For example, each of a first memory column group MCG1 and a second memory column group MCG2 disposed adjacent to each other in the X-axis direction may include a plurality of memory columns disposed adjacent to each other in the X-axis direction.

A certain number of peripheral columns adjacent to each other in the X-axis direction may constitute one peripheral column group in a peripheral region. For example, each of a first peripheral column group PCG1 and a second peripheral column group PCG2 disposed adjacent to each other in the X-axis direction may include a plurality of peripheral columns disposed adjacent to each other in the X-axis direction.

The first peripheral column group PCG1 may correspond to the first memory column group MCG1, and the second peripheral column group PCG2 may correspond to the second memory column group MCG2. The first peripheral column group PCG1 and the first memory column group MCG1 may be aligned with each other in the Y-axis direction, and may have the same width in the X-axis direction. The second peripheral column group PCG2 and the second memory column group MCG2 may be aligned with each other in the Y-axis direction, and may have the same width in the X-axis direction.

The power line PL may be disposed at a boundary of each of the first peripheral column group PCG1 and the second peripheral column group PCG2. Standard cells disposed in the first peripheral column group PCG1 and the second peripheral column group PCG2 may receive voltage from the power line PL.

Because the first peripheral column group PCG1 and the second peripheral column group PCG2 disposed adjacent to each other in the X-axis direction share the power line PL disposed at the boundary, the first peripheral column group PCG1 and the second peripheral column group PCG2 may have a layout in which the first peripheral column group PCG1 and the second peripheral column group PCG2 flip to each other (are left and right symmetric) with respect to the Y-axis. Also, the first peripheral column group PCG1 may have a layout in which other peripheral column groups adjacent in the −X-axis direction flip with respect to the Y-axis, and the second peripheral column group PCG2 may have a layout in which other peripheral column groups adjacent in the X-axis direction flip with respect to the Y-axis.

Referring to FIG. 9, the first peripheral column group PCG1 may have the same layout as the peripheral column group PCG described with reference to FIG. 3. The second peripheral column group PCG2 may have the same layout as a layout in which the first peripheral column group PCG1 flips with respect to the Y-axis.

The second peripheral column group PCG2 may be aligned with the second memory column group MCG2 in the Y-axis direction, and may have the same width in the X-axis direction.

The second memory column group MCG2 may include fifth to eighth memory columns 21_5 to 21_8 that are sequentially arranged to be adjacent to each other in the X-axis direction, and the second peripheral column group PCG2 may include sixth to tenth peripheral columns COL6 to COL10 that are sequentially arranged to be adjacent to each other in the X-axis direction. FIG. 9 illustrates that four memory columns and five peripheral columns correspond to each other at a ratio of 4:5, but the ratio is not limited thereto and may be modified in various ways.

Each of the fifth to eighth memory columns 21_5 to 21_8 may be connected to a corresponding bit line (one of bit lines BL4 to BL7) and a corresponding complementary bit line (one of complementary bit lines BLB4 to BLB7). The bit cells 21 of FIG. 1 disposed in the fifth to eighth memory columns 21_5 to 21_8 and standard cells disposed in the second peripheral column group PCG2 may be electrically connected to each other through the bit lines BL4 to BL7 and the complementary bit lines BLB4 to BLB7.

In an embodiment, the second peripheral column group PCG2 may include columns having different heights. For example, the sixth, seventh, ninth, and tenth peripheral columns COL6, COL7, COL5, and COL10 may have the first cell height CH1, and the eighth peripheral column COL8 disposed in the center of the second peripheral column group PCG2 may have the second cell height CH2 that is different from the first cell height CH1. In this case, the first cell height CH1 may be greater than the second cell height CH2.

A plurality of power lines, for example, sixth to eleventh power lines PL6 to PL11, supplying voltages to standard cells disposed in the sixth to tenth peripheral columns COL6 to COL10 may be respectively disposed at boundaries of the sixth to tenth peripheral columns COL6 to COL10. The sixth to eleventh power lines PL6 to PL11 may be formed in a conductive pattern extending in the Y-axis direction, and may be spaced apart from each other in the X-axis direction. For example, a power voltage may be applied to each of the seventh, ninth, and eleventh power lines PL7, PL9, and PL11, and a ground voltage of a level lower than that of the power voltage may be applied to each of the sixth, eighth, and tenth power lines PL6, PL8, and PL10. Because the first peripheral column group PCG1 and the second peripheral column group PCG2 have the layout in which the first peripheral column group PCG1 and the second peripheral column group PCG2 flip to each other with respect to the Y-axis, the first peripheral column group PCG1 and the second peripheral column group PCG2 may share the sixth power line PL6 to which a specific voltage is applied.

Figure 10:
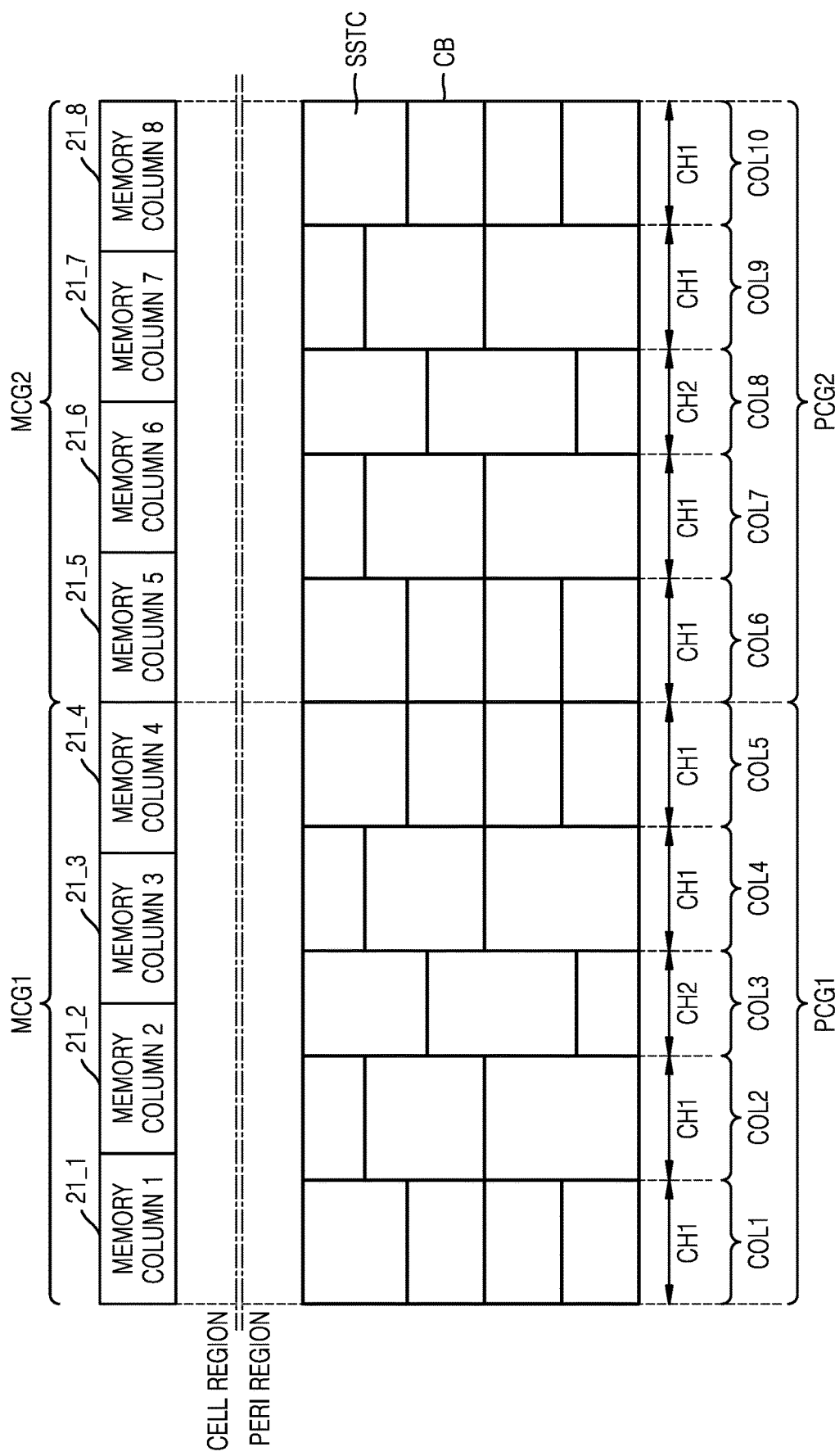
FIGS. 10 and 11 are diagrams illustrating a layout of a semiconductor device, according to an embodiments.
Figure 11:
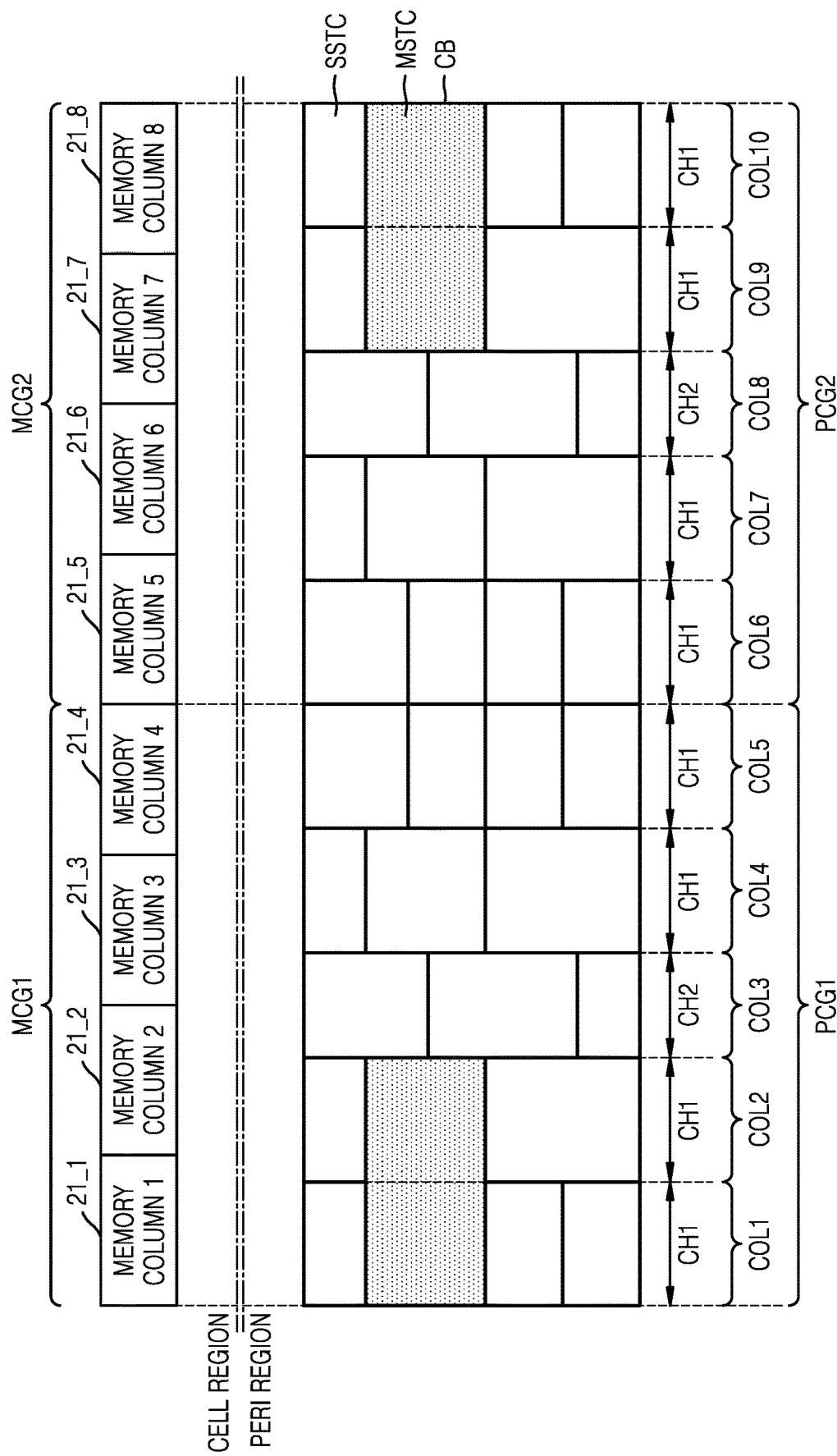

FIGS. 10 and 11 are diagrams illustrating a layout of a semiconductor device, according to embodiments. FIGS. 10 and 11 are diagrams illustrating standard cells SSTC and MSTC disposed in a peripheral region.

Referring to FIG. 10, the plurality of standard cells SSTC may be disposed in the first to tenth peripheral columns COL1 to COL10. In an embodiment, the arrangement of the standard cells SSTC of the first memory column group MCG1 and the arrangement of the standard cells SSTC of the second memory column group MCG2 may flip to each other with respect to the Y-axis.

The plurality of standard cells SSTC may be defined by a cell boundary CB. Each of the plurality of standard cells SSTC disposed in the first to tenth peripheral columns COL1 to COL10 may be a single height cell disposed in one peripheral column. For example, the standard cell SSTC disposed in the first peripheral column COL1 may have the first cell height CH1, and the standard cell SSTC disposed in the third peripheral column COL3 may have the second cell height CH2.

Referring to FIG. 11, a plurality of standard cells may be disposed in the first to tenth peripheral columns COL1 to COL10. In an embodiment, the arrangement of the standard cells of the first memory column group MCG1 and the arrangement of the standard cells of the second memory column group MCG2 may flip to each other with respect to the Y-axis.

The plurality of standard cells may include the single height cell SSTC disposed in one of the first to tenth peripheral columns COL1 to COL10, and multiple height cells MSTC disposed in at least two peripheral columns among the first to tenth peripheral columns COL1 to COL10. For example, the single height cell SSTC disposed in the first peripheral column COL1 may have the first cell height CH1, and the single height cell SSTC disposed in the third peripheral column COL3 may have the second cell height CH2. Also, for example, the multiple height cell MSTC disposed across the first peripheral column COL1 and the second peripheral column COL2 may have a height obtained by summing the first cell height CH1 and the first cell height CH1, and the multiple height cell MSTC disposed across the ninth and tenth peripheral columns COL5 and COL10 may have a height obtained by summing the first cell height CH1 and the first cell height CH1.

The arrangement of the standard cells in the peripheral region shown in FIGS. 10 and 11 is an example for convenience of description, and the semiconductor device according to the embodiment is not limited to that illustrated in FIGS. 10 and 11. Standard cells of various cell heights may be disposed in the first to tenth peripheral columns COL1 to COL10.

Among the standard cells disposed in the peripheral region, a standard cell requiring a relatively great driving force may be disposed in a peripheral column, which has a relatively great cell height. For example, the MUX included in the write driver (33-1 of FIG. 1) and the read driver (33-2 of FIG. 1) of the column driver (33 of FIG. 1) may be implemented as the single height cell SSTC disposed in the first, second, fourth, and fifth peripheral columns COL1, COL2, COL4, and COL5 rather than the third peripheral column COL3, or may be implemented as the multiple height cell MSTC.

Figure 12:
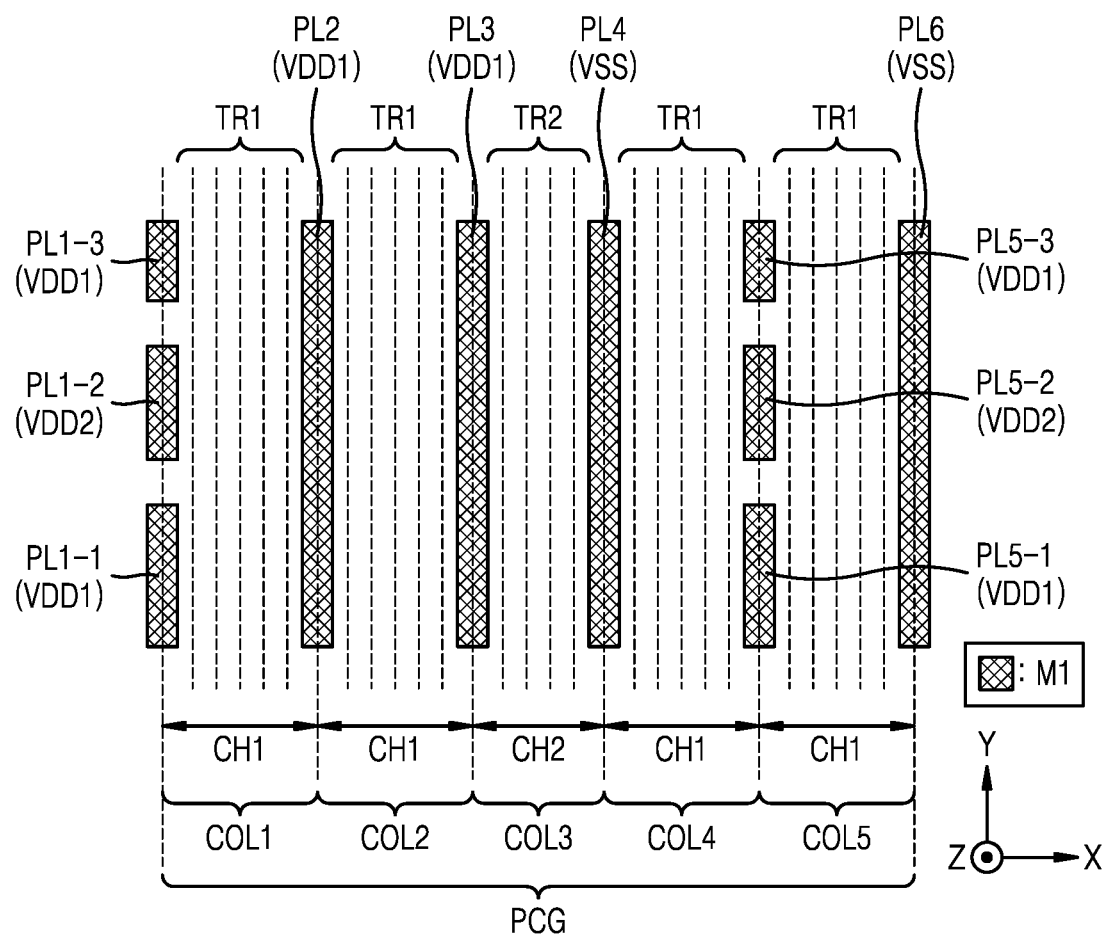
FIG. 12 is a diagram illustrating a layout of a semiconductor device, according to an embodiment.

FIG. 12 is a diagram illustrating a layout of a semiconductor device, according to an embodiment. FIG. 12 is a diagram illustrating a pattern of the first metal layer M1 disposed in a peripheral region.

Referring to FIG. 12, a plurality of power lines supplying voltages to standard cells disposed in the first to fifth peripheral columns COL1 to COL5 included in the peripheral column group PCG may be respectively disposed at boundaries of the first to fifth peripheral columns COL1 to COL5.

The plurality of power lines may include first power lines PL1-1 to PL1-3, the second power line PL2, the third power line PL3, the fourth power line PL4, fifth power lines PL5-1 to PL5-3, and the sixth power line PL6, and each may be formed in a conductive pattern extending in the Y-axis direction.

The first power lines PL1-1 to PL1-3 may be sequentially disposed in the Y-axis direction. A first power voltage VDD1 may be applied to the first power lines PL1-1 and PL1-3 among the first power lines PL1-1 to PL1-3, and a second power voltage VDD2 may be applied to the other first power line PL1-2 among the first power lines PL1-1 to PL1-3. In order to inactivate some bit cells 21 in FIG. 1 of the memory cell block 20 in FIG. 1 when the semiconductor device operates in a specific mode, the first power voltage VDD1 and the second power voltage VDD2 of different levels may be required.

In addition, the fifth power lines PL5-1 to PL5-3 may be sequentially disposed in the Y-axis direction. The first power voltage VDD1 may be applied to the fifth power lines PL5-1 and PL5-3 among the fifth power lines PL5-1 to PL5-3, and the second power voltage VDD2 may be applied to the other fifth power line PL5-2 among the fifth power lines PL5-1 to PL5-3.

The first power voltage VDD1 may be applied to the second power line PL2 and the third power line PL3, and a ground voltage of a lower level than a power voltage may be applied to the fourth power line PL4 and the sixth power line PL6.

A plurality of tracks on which patterns of the first metal layer M1 are disposed may be formed in each of the first to fifth peripheral columns COL1 to COL5. A conductive pattern extending in the Y-axis direction may be formed on each of the plurality of tracks.

First tracks TR1 may be formed in each of the first, second, fourth, and fifth peripheral columns COL1, COL2, COL4, and COL5, and second tracks TR2 may be formed in the third peripheral column COL3. Because the first cell height CH1 of each of the first, second, fourth, and fifth peripheral columns COL1, COL2, COL4, and COL5 is greater than the second cell height CH2 of the third peripheral column COL3, the number of tracks of the first tracks TR1 may be greater than the number of tracks of the second tracks TR2. For example, the number of tracks of the first tracks TR1 may be five (5) and the number of tracks of the second tracks TR2 may be four (4), but the embodiment is not limited thereto.

Figure 13:
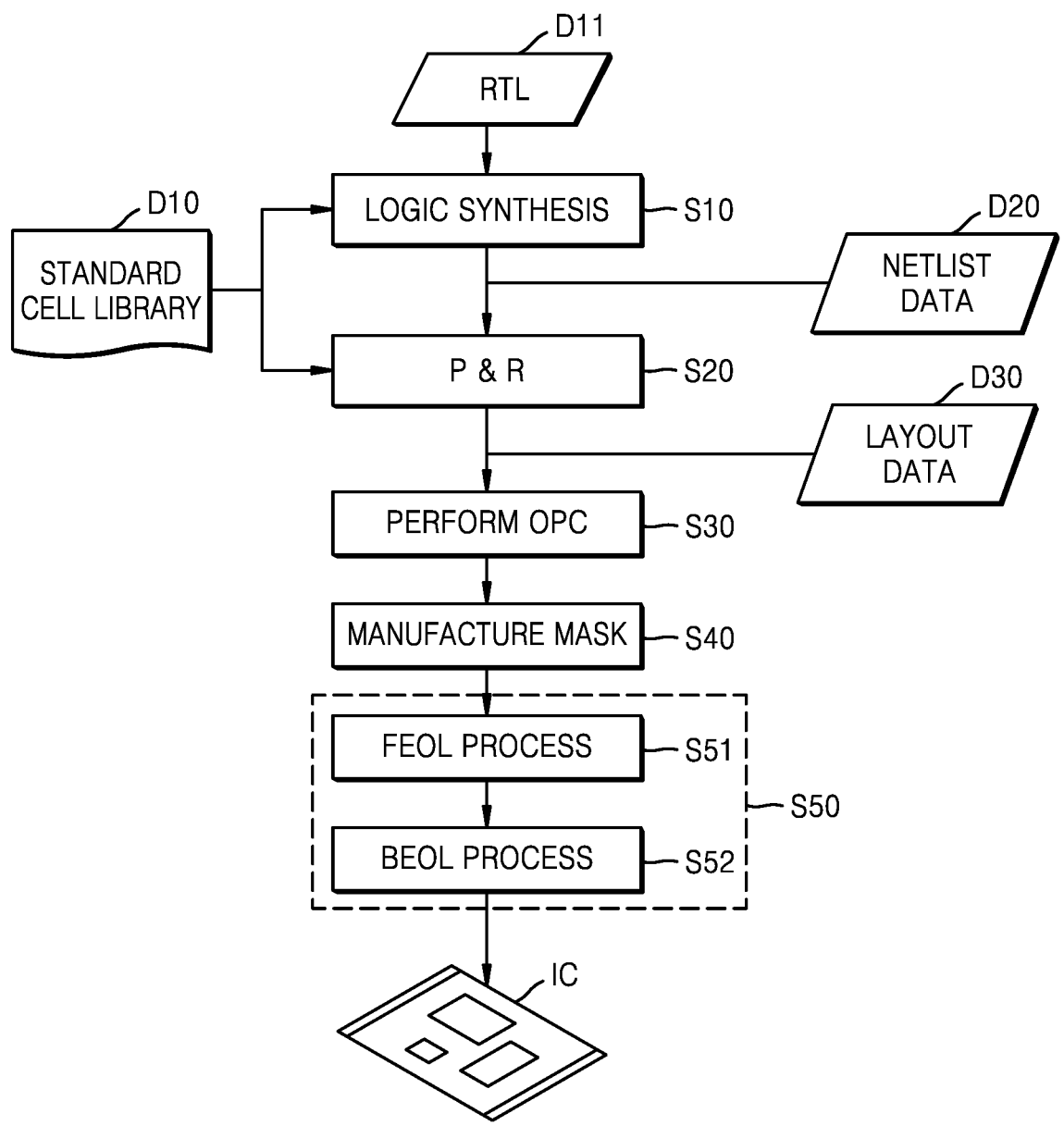
FIG. 13 is a flowchart illustrating a method of manufacturing a semiconductor device, according to an embodiment.

FIG. 13 is a flowchart illustrating a method of manufacturing a semiconductor device IC according to an embodiment.

Referring to FIG. 13, a standard cell library D10 may include information about standard cells, for example, function information, characteristic information, and layout information. The standard cell library D10 may include data defining the layout of standard cells. The data may include data defining the structure of standard cells that perform the same function and have different layouts.

In operation S10, a logic synthesis operation of generating netlist data D20 from RTL data D11 may be performed. For example, a semiconductor design tool (e.g., a logic synthesis module) may generate the netlist data D20 including a bitstream or a netlist by performing the logic synthesis operation with reference to the standard cell library D10 from the RTL data D11 written in a hardware description language (HDL) such as a VHSIC hardware description language (VHDL) or Verilog. The standard cell library D10 may include the data DC defining the structure of standard cells performing the same function and having different layouts, and the standard cells may be included in the semiconductor device IC in a logic synthesis process with reference to such information.

In operation S20, a placing & routing (P&R) operation of generating layout data D30 from the netlist data D20 may be performed. The layout data D30 may have a format such as GDSII and may include geometric information of standard cells and interconnections.

For example, a semiconductor design tool (e.g., a P&R module) may place a plurality of standard cells with reference to the standard cell library D10 from the netlist data D20. With reference to the data, the semiconductor design tool may select one of the layouts of the standard cell defined by a netlist data D20 and may place the selected layout of the standard cell.

The method of manufacturing the semiconductor device IC according to an embodiment may place standard cells having various heights in a plurality of peripheral columns of various heights, thereby optimizing placement of standard cells according to the performance of each of the standard cells. Accordingly, the area and performance of the manufactured semiconductor device IC may be optimized.

In operation S20, an operation of generating interconnections may be further performed. The interconnection may electrically connect an output pin to an input pin of the standard cell, and may include, for example, at least one via and at least one conductive pattern.

In operation S30, an optical proximity correction (OPC) may be performed. The OPC may refer to an operation for forming a pattern of a desired shape by correcting a distortion phenomenon such as refraction caused by the characteristic of light in photolithography included in a semiconductor process of fabricating the semiconductor device IC, and a pattern on a mask may be determined by applying the OPC to the layout data D30. In an embodiment, the layout of the semiconductor device IC may be restrictively modified in operation S30, and restrictively modifying the semiconductor device IC in operation S30 may be referred to as design polishing as post-processing for optimizing the structure of the semiconductor device IC.

In operation S40, an operation of manufacturing a mask may be performed. For example, as the OPC is applied to the layout data D30, patterns on the mask may be defined to form patterns formed on a plurality of layers, and at least one mask (or at least one photomask) for forming patterns of each of the plurality of layers may be manufactured.

In operation S50, an operation of manufacturing the semiconductor device IC may be performed. For example, the semiconductor device IC may be manufactured by patterning the plurality of layers by using the at least one mask manufactured in operation S40. Operation S50 may include operations S51 and S52.

In operation S51, a front-end-of-line (FEOL) process may be performed. The FEOL process may refer to a process of forming individual devices, for example, transistors, capacitors, or resistors in a substrate in the process of manufacturing the semiconductor device IC. For example, the FEOL process may include an operation of planarizing and cleaning a wafer, an operation of forming trenches, an operation of forming wells, an operation of forming gate lines, an operation of forming source and drain regions, etc.

In operation S52, a back-end-of-line (BEOL) process may be performed. The BEOL process may refer to a process of interconnecting individual devices, for example, transistors, capacitors, or resistors, to one another in the process of fabricating the semiconductor device IC. For example, the BEOL process may include an operation of performing silicidation of gate, source, and drain regions, an operation of adding a dielectric, a planarization operation, an operation of forming holes, an operation of forming metal layers, an operation of forming vias, an operation of forming a passivation layer, etc. Thereafter, the semiconductor device IC may be packaged in a semiconductor package and may be used as a component in various applications.

Figure 14:
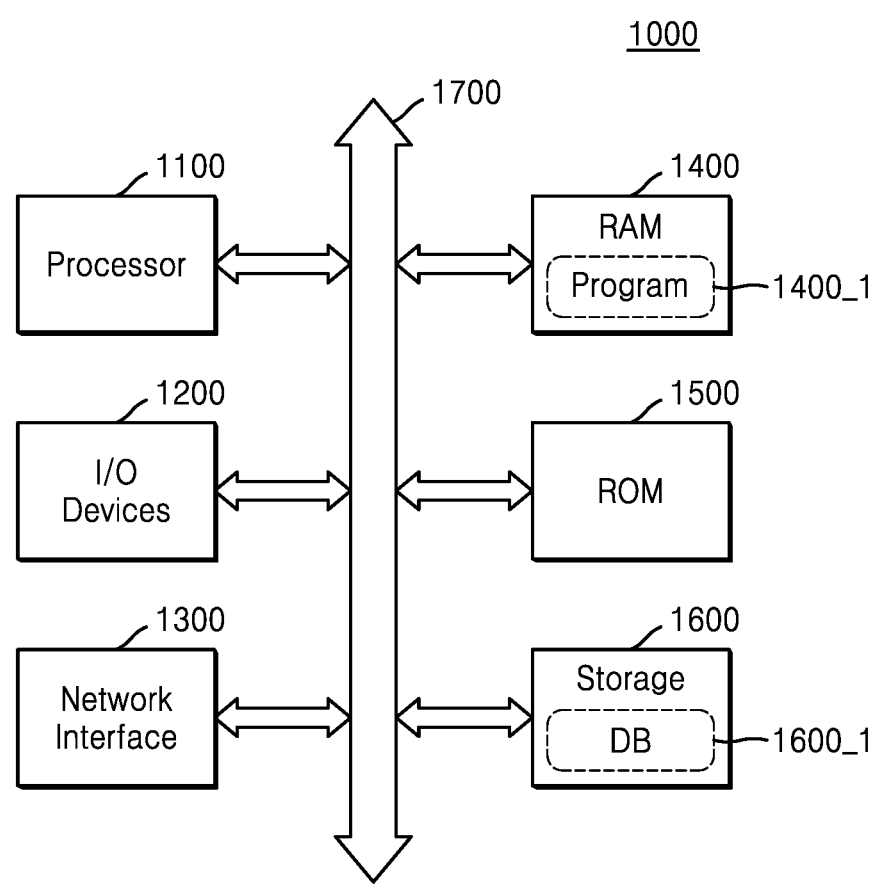
FIG. 14 is a block diagram illustrating a computing system including memory storing a program, according to an embodiment.

FIG. 14 is a block diagram illustrating a computing system 1000 including memory storing a program according to an embodiment. At least some of operations included in a method of manufacturing a semiconductor device (for example, the method of manufacturing the semiconductor device IC of FIG. 13) according to an embodiment may be performed by the computing system 1000.

Referring to FIG. 14, the computing system 1000 may be a stationary computing system such as a desktop computer, a workstation, or a server or a portable computing system such as a laptop computer. The computing system 1000 may include a processor 1100, input and output devices 1200, a network interface 1300, random access memory (RAM) 1400, read only memory (ROM) 1500, and a storage 1600. The processor 1100, the input and output devices 1200, the network interface 1300, the RAM 1400, the ROM 1500, and the storage 1600 may communicate with one another through a bus 1700.

The processor 1100 may be referred to as a processing unit and may include, for example, at least one core capable of executing an arbitrary instruction set such as a microprocessor, an application processor (AP), a digital signal processor (DSP), or a graphics processing unit (GPU). For example, the processor 1100 may access the memory, that is, the RAM 1400 or the ROM 1500, through the bus 1700 and may execute instructions stored in the RAM 1400 or the ROM 1500.

The RAM 1400 may store a program 1400_1 for manufacturing the semiconductor device according to an embodiment or at least a part of the program 1400_1. For example, the program 1400_1 may include a semiconductor design tool and may include, for example, a logic synthesis tool and a P&R tool.

The program 1400_1 may have the processor 1100 perform at least some of the operations included in the method of manufacturing the semiconductor device IC of FIG. 13. That is, the program 1400_1 may include a plurality of instructions that may be executed by the processor 1100, and the plurality of instructions included in the program 1400_1 may make the processor 1100 perform at least some of the operations included in the method of manufacturing the semiconductor device IC of FIG. 13.

The storage 1600 may not lose stored data although power supplied to the computing system 1000 is blocked. For example, the storage 1600 may include a non-volatile memory device or a storage medium such as a magnetic tape, an optical disk, or a magnetic disk. The storage 1600 may store the program 1400_1 according to an embodiment, and the program 1400_1 or at least a part thereof may be loaded from the storage 1600 on the RAM 1400 before the program 1400_1 is executed by the processor 1100.

Unlikely, the storage 1600 may store a file written in a program language, and the program 1400_1 generated by a compiler from a file or at least a part thereof may be loaded on the RAM 1400.

The storage 1600 may store a database 1600_1, and the database 1600_1 may include information necessary for designing the semiconductor device. For example, the database 1600_1 may include the standard cell library D10 of FIG. 13. In addition, the storage 1600 may store data to be processed by the processor 1100 or data processed by the processor 1100.

The input and output devices 1200 may include an input device such as a keyboard or a pointing device and an output device such as a display device or a printer. The network interface 1300 may provide access to a network outside the computing system 1000.

While the disclosure has been particularly shown and described with reference to embodiments thereof, it will be understood that various changes in form and details may be made therein without departing from the spirit and scope of the disclosure.

What is claimed is:

1. A semiconductor device comprising:
a first memory column group comprising a plurality of memory columns in which a plurality of bit cells are disposed; and
a first peripheral column group comprising a plurality of peripheral columns in which a plurality of standard cells are disposed,
wherein the plurality of standard cells are configured to perform an operation of reading/writing data from/to the plurality of bit cells through a plurality of bit lines,
wherein the first memory column group and the first peripheral column group correspond to each other in a column direction,
wherein at least one of the plurality of peripheral columns has a cell height different from cell heights of the other peripheral columns, the cell height being measured in a row direction in which a gate line is extended, and
wherein the plurality of standard cells comprise a multiple-height cell disposed across at least two peripheral columns among the plurality of peripheral columns.

2. The semiconductor device of claim 1, wherein the plurality of peripheral columns included in the first peripheral column group comprise a plurality of first peripheral columns having a first cell height, and a second peripheral column having a second cell height,
wherein the first cell height is greater than the second cell height, and
wherein a width of an active region formed in the plurality of first peripheral columns in the row direction is greater than a width of an active region formed in the second peripheral column in the row direction.

3. The semiconductor device of claim 1, wherein the plurality of peripheral columns included in the first peripheral column group comprise a plurality of first peripheral columns having a first cell height, and a second peripheral column having a second cell height,
wherein the first cell height is greater than the second cell height, and
wherein a number of active regions formed in the plurality of first peripheral columns is greater than a number of active regions formed in the second peripheral column.

4. The semiconductor device of claim 1, wherein the plurality of peripheral columns included in the first peripheral column group comprise a plurality of first peripheral columns having a first cell height, and a second peripheral column having a second cell height that is different from the first cell height, and
wherein the second peripheral column is disposed in a center of the first peripheral column group.

5. The semiconductor device of claim 1, wherein the plurality of peripheral columns included in the first peripheral column group comprise a plurality of first peripheral columns having a first cell height, and a second peripheral column having a second cell height that is different from the first cell height, and
wherein the second peripheral column is disposed adjacent to a boundary of the first peripheral column group.

6. The semiconductor device of claim 1, further comprising:
a second memory column group comprising a plurality of memory columns in which a plurality of bit cells are disposed; and
a second peripheral column group comprising a plurality of peripheral columns in which another plurality of standard cells are configured to perform an operation of reading/writing data from/to the plurality of bit cells of the second memory column group are disposed,
wherein the second memory column group and the second peripheral column group correspond to each other in a column direction;
wherein, in the second peripheral column group, at least one of the plurality of peripheral columns has a cell height different from cell heights of the other peripheral columns, and
wherein the first peripheral column group and the second peripheral column group are adjacent to each other in the row direction.

7. The semiconductor device of claim 6, wherein the first peripheral column group and the second peripheral column group have a layout in which the first peripheral column group and the second peripheral column group are symmetrical to each other with respect to an axis therebetween in the column direction.

8. The semiconductor device of claim 1, further comprising:
a plurality of power lines disposed at boundaries of the plurality of peripheral columns and configured to provide a power voltage to the plurality of standard cells.

9. The semiconductor device of claim 8, wherein the plurality of power lines comprise power lines which are disposed at a same boundary among the boundaries and to which a first power voltage and a second power voltage of different levels are respectively applied.

10. The semiconductor device of claim 8, wherein the plurality of bit lines and the plurality of power lines are formed on a same metal layer.

11. The semiconductor device of claim 1, wherein each of the plurality of bit cells comprises a static random access memory (SRAM) cell.

12. A semiconductor device comprising:
a cell region in which a memory cell block comprising a plurality of bit cells is formed; and
a peripheral region in which a peripheral circuit configured to read/write data through a plurality of bit lines connected to the memory cell block is formed,
wherein the peripheral region comprises a plurality of peripheral columns in which a plurality of standard cells are disposed,
wherein at least one of the plurality of peripheral columns has a cell height different from cell heights of the other peripheral columns, the cell height being measured in a row direction in which a gate line is extended, and wherein the plurality of standard cells comprise a multiple-height cell disposed across at least two peripheral columns among the plurality of peripheral columns.

13. The semiconductor device of claim 12, wherein the cell region comprises a plurality of memory columns in which the plurality of bit cells are disposed;

wherein a number of memory columns among the plurality of memory columns constitutes a memory column group, wherein a number of peripheral columns among the plurality of peripheral columns constitutes a peripheral column group, wherein the memory column group and the peripheral column group are aligned with each other in a column direction, and wherein the plurality of peripheral columns have different cell heights.

14. The semiconductor device of claim 12, wherein the peripheral circuit comprises a read driver configured to read data from the memory cell block through the plurality of bit lines, and a write driver configured to write data to the memory cell block through the plurality of bit lines, and wherein at least one standard cell among the plurality of standard cells which is configured to implement the read driver and the write driver is disposed in a peripheral column which has the greatest cell height among the plurality of peripheral columns.

15. The semiconductor device of claim 12, wherein at least one active region extending in a column direction is formed in each of the plurality of peripheral columns, wherein a number of the at least one active region formed in at least one of the plurality of peripheral columns is different from a number of the at least one active region formed in at least another one of the plurality of peripheral columns, and wherein the at least one and the at least another one of the plurality of peripheral columns have different cell heights.

16. The semiconductor device of claim 12, wherein a plurality of active regions extending in a column direction are formed in each of the plurality of peripheral columns, wherein the plurality of peripheral columns comprise a first peripheral column and a second peripheral column having different cell heights, and wherein a width of active region formed in the first peripheral column in the row direction is different from a width of active region formed in the second peripheral column in the row direction.

17. A semiconductor device comprising:

a cell region in which a memory column group, comprising a plurality of memory columns in which a plurality of bit cells are formed, is disposed; and a peripheral region in which a peripheral column group, comprising a plurality of peripheral columns in which a plurality of standard cells electrically connected to the plurality of bit cells are formed, is disposed, and the peripheral region is disposed parallel to the cell region in a column direction, wherein the memory column group and the peripheral column group are aligned with each other in the column direction, wherein the peripheral column group comprises a first peripheral column and a second peripheral column having different cell heights, the cell height being measured in a row direction in which a gate line is extended, and wherein the plurality of standard cells comprise a multiple-height cell disposed across at least two peripheral columns among the plurality of peripheral columns.

18. The semiconductor device of claim 17, wherein a number of memory columns included in the memory column group is different from a number of peripheral columns included in the peripheral column group.

19. The semiconductor device of claim 17, wherein the peripheral region comprises an N-well formed across at least two of the plurality of peripheral columns and comprising N-type impurities.

* * * * *